United States Patent
McCord et al.

(10) Patent No.: US 9,666,411 B1
(45) Date of Patent: May 30, 2017

(54) VIRTUAL GROUND FOR TARGET SUBSTRATE USING FLOODGUN AND FEEDBACK CONTROL

(71) Applicant: KLA-Tencor Corporation, Milpitas, CA (US)

(72) Inventors: Mark A. McCord, Los Gatos, CA (US); Gabor D. Toth, Gilroy, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/929,812

(22) Filed: Nov. 2, 2015

Related U.S. Application Data

(60) Provisional application No. 62/080,014, filed on Nov. 14, 2014.

(51) Int. Cl.
  *G21K 5/04* (2006.01)
  *H01J 37/26* (2006.01)
  *H01J 37/285* (2006.01)
  *H01J 37/20* (2006.01)

(52) U.S. Cl.
  CPC .......... *H01J 37/265* (2013.01); *H01J 37/20* (2013.01); *H01J 37/285* (2013.01)

(58) Field of Classification Search
  CPC .. H01J 29/48; H01J 29/50; H01J 29/52; H01J 37/26; H01J 2237/00; H01J 2237/04
  USPC ... 250/396 R, 397, 305, 306, 307, 309, 310, 250/311, 492.1, 492.2, 492.3
  See application file for complete search history.

(56) References Cited

U.S. PATENT DOCUMENTS

| | | |
|---|---|---|
| 4,417,203 A | 11/1983 | Pfeiffer et al. |
| 6,528,818 B1 | 3/2003 | Satya et al. |
| 6,627,884 B2 | 9/2003 | McCord et al. |
| 6,664,546 B1 * | 12/2003 | McCord .............. H01J 37/28 250/310 |
| 6,720,556 B2 | 4/2004 | Cohen et al. |
| 6,867,606 B2 | 3/2005 | Pinto et al. |
| 7,187,186 B2 | 3/2007 | Shi et al. |
| 7,202,691 B2 | 4/2007 | Lagowski et al. |
| 7,675,730 B2 | 3/2010 | Walther et al. |
| 7,719,294 B1 | 5/2010 | Samsavar et al. |
| 7,730,434 B2 | 6/2010 | Aghababazadeh et al. |
| 8,016,114 B2 | 9/2011 | Rider et al. |
| 8,803,103 B2 | 8/2014 | Nakasuji et al. |

OTHER PUBLICATIONS

Keith A. Jenkins, et al. "Analysis of silicide process defects by non-contact electron-beam charging", Mar. 31-Apr. 2, 1992, pp. 304-308, Reliability Physics Symposium 1992, IEEE 30th Annual Proceedings.

* cited by examiner

*Primary Examiner* — Nicole Ippolito

(74) *Attorney, Agent, or Firm* — Okamoto & Benedicto LLP

(57) ABSTRACT

One embodiment relates to an apparatus for virtual grounding of a target substrate in a charged-particle beam apparatus. A primary gun generates charged particles for a process beam that is focused on a frontside surface of the target substrate, and the target substrate is held by a stage. An electrostatic voltmeter measures a voltage potential of the target substrate, and a charge-control gun impinges a beam of charged particles to the target substrate. A feedback control loop is used to control the flood gun depending on the voltage potential measured by the electrostatic voltmeter. Other embodiments, aspects and features are also disclosed.

21 Claims, 4 Drawing Sheets

100

1

VIRTUAL GROUND FOR TARGET SUBSTRATE USING FLOODGUN AND FEEDBACK CONTROL

CROSS-REFERENCE TO RELATED APPLICATIONS

The present patent application claims the benefit of U.S. provisional patent application No. 62/080,014 filed Nov. 14, 2014, the disclosure of which is hereby incorporated by reference in its entirety.

BACKGROUND OF THE INVENTION

Field of the Invention

The present disclosure relates to electron beam and ion beam systems.

Description of the Background Art

In a conventional scanning electron microscope (SEM) based inspection instrument, a manufactured substrate (such as a silicon wafer or a reticle) is scanned with a focused beam of electrons which results in the emission of secondary electrons from the substrate surface. The emitted electrons are detected, and the detection data is typically converted into images of the surface of the specimen. These images are then analyzed numerically to detect abnormalities (referred to as defects) in the manufactured substrate. The detected defects may be subsequently reviewed by further imaging.

SUMMARY

Figure 1:
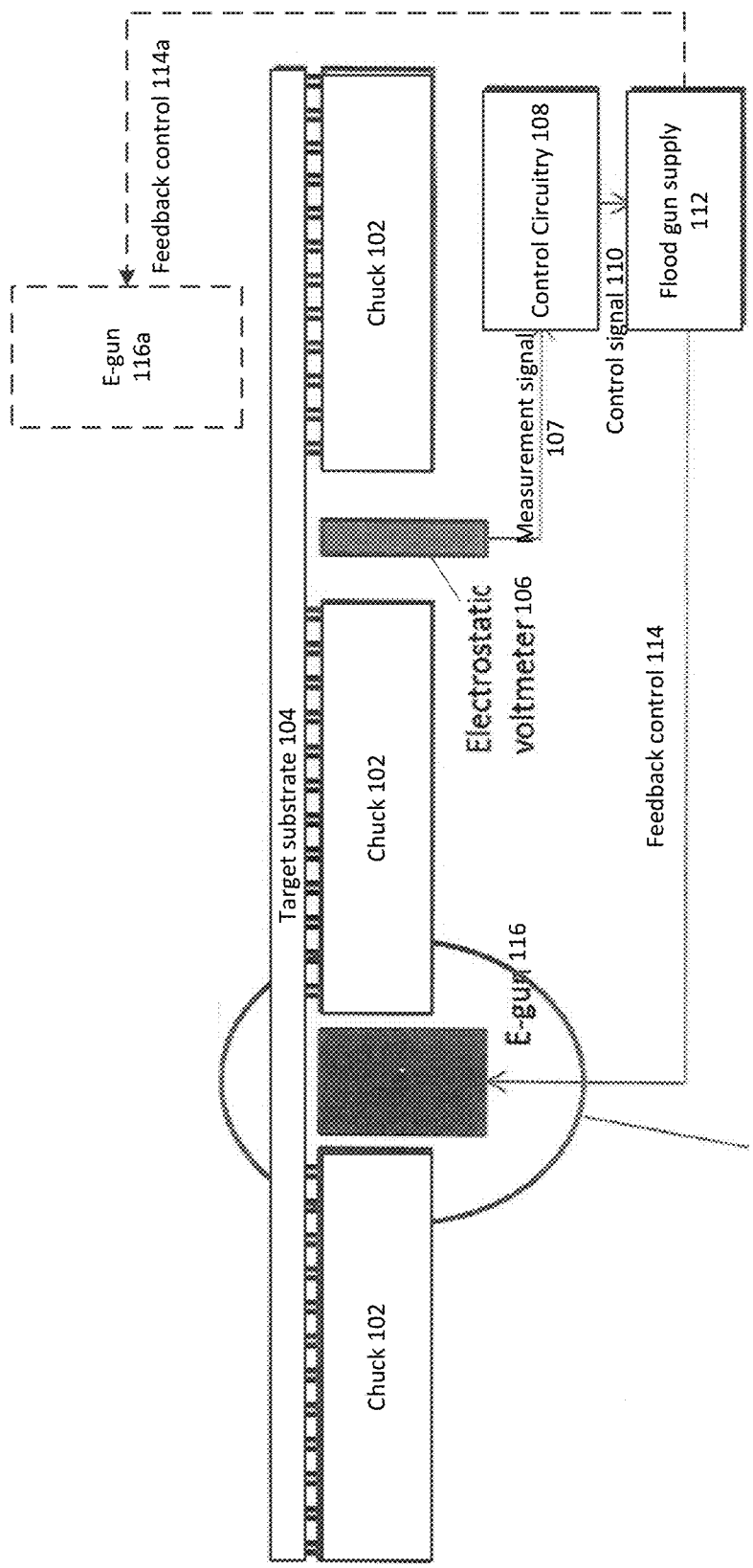
FIG. 1 is a schematic diagram of an apparatus for virtual grounding of a target substrate using a floodgun and feedback control in accordance with an embodiment of the invention.

One embodiment relates to an apparatus for virtual grounding of a target substrate in a charged-particle beam apparatus. A primary gun generates charged particles for a process beam that is focused on a frontside surface of the target substrate, and the target substrate is held by a stage. An electrostatic voltmeter measures a voltage potential of the target substrate, and a charge-control gun impinges a beam of charged particles to the target substrate. A feedback control loop is used to control the flood gun depending on the voltage potential measured by the electrostatic voltmeter.

Another embodiment relates to a method for virtual grounding of a target substrate in a charged-particle beam apparatus. A process beam of charged particles is focused upon a front surface of the target substrate. An electrostatic potential of the target substrate is measured using an electrostatic voltmeter, and a feedback control signal is generated based on the electrostatic potential. Adjustments to a charge-control beam that impinges upon the target substrate are made based on the feedback signal.

Another embodiment relates to an apparatus for automated inspection and/or review of a target substrate. An electron beam column generates a primary electron beam and focuses the primary electron beam onto a frontside surface of the target substrate. A moveable stage holds the target substrate under the primary electron beam. A voltage potential of the target substrate is measured. A flood gun impinges a beam of electrons onto the backside surface of the target substrate. A feedback control loop adjusts a charge control electrode of the flood gun depending on the measured voltage potential.

Other embodiments, aspects and features are also disclosed.

DETAILED DESCRIPTION

In a scanning electron beam apparatus or in other charged-particle beam apparatus, variations in the electrostatic potential of the sample, such as a silicon wafer, may cause imaging problems, including defocus and positional errors. Such variations in the potential may be due to the accumulation of charge from the electron beam or ion beam impinging on the sample. Hence, it is often desirable to maintain a sample at a fixed electrostatic potential.

Current methods to maintain such a fixed potential commonly involve using grounding pins to contact the back surface of the wafer. However, the grounding pins often need to penetrate a thick oxide film that covers the surface of the wafer. Unfortunately, penetrating the thick oxide film may cause damage to the wafer and may furthermore cause the release of particles into the vacuum chamber. Such particles may adversely affect yield and subsequent processing of the devices on the wafer.

The present disclosure provides a solution for maintaining a target substrate at a fixed potential in an electron beam or ion beam apparatus. Such an apparatus may be utilized, for example, in an inspection, review or lithography system. Advantageously, the presently-disclosed solution maintains the fixed potential without needing to physically contact the substrate with grounding pins.

FIG. 1 is a schematic diagram of an apparatus 100 for virtual grounding of a target substrate using a floodgun (E-gun 116) and feedback control in accordance with an embodiment of the invention. As shown in the cross-section depicted in FIG. 1, the target substrate 104 (such as a silicon wafer, a reticle, or other substrate) may be held on a chuck 102 of a substrate holder.

The apparatus 100 includes an electrostatic voltmeter 106 that measures a voltage potential of a backside of the target substrate 104. The electrostatic voltmeter 106 may be embedded in the chuck 102, or the chuck 102 may be fabricated with a hole to allow the electrostatic voltmeter 106 to be positioned in proximity of the backside of the target substrate 104, as shown. In one embodiment, the electrostatic voltmeter 106 may be implemented as a Kelvin probe or other non-contact voltmeter, or as a contacting voltmeter. The electrostatic voltmeter 106 senses the voltage potential of the target substrate 104 and generates a measurement signal 107 indicative of that voltage potential.

The measurement signal 107 from the electrostatic voltmeter 106 may be provided to control circuitry 108. The control circuitry 108 uses the measurement signal 107 to generate a control signal 110 that is sent to the flood gun supply 112.

The flood gun supply 112 outputs a feedback control signal 114 that is provided to the electron-beam flood gun (E-gun) 116. In one implementation, the feedback control signal 114 is a voltage that is applied to a charge control electrode 206 of the electron-beam flood gun 116 (see FIG. 2).

The electron-beam flood gun (E-gun) 116 may be emits a flood beam of electrons that impinges on the backside of the target substrate 104. In one implementation, the electron-beam flood gun 116 may be embedded in the chuck 102 that holds the target substrate 104.

Note that the feedback control circuitry, shown in FIG. 1 as the control circuitry 108 and the flood gun supply 112, may be implemented in various ways. In one implementation, the feedback control circuitry may be implemented with analog circuitry, using a high-voltage amplifier with a control circuit such as a PID (proportional-integral-derivative) circuit. In another implementation, the feedback control circuitry may be implemented using digital circuitry, using a linear or non-linear control function with a control signal output to a high-voltage amplifier using a digital-to-analog converter.

Figure 2:
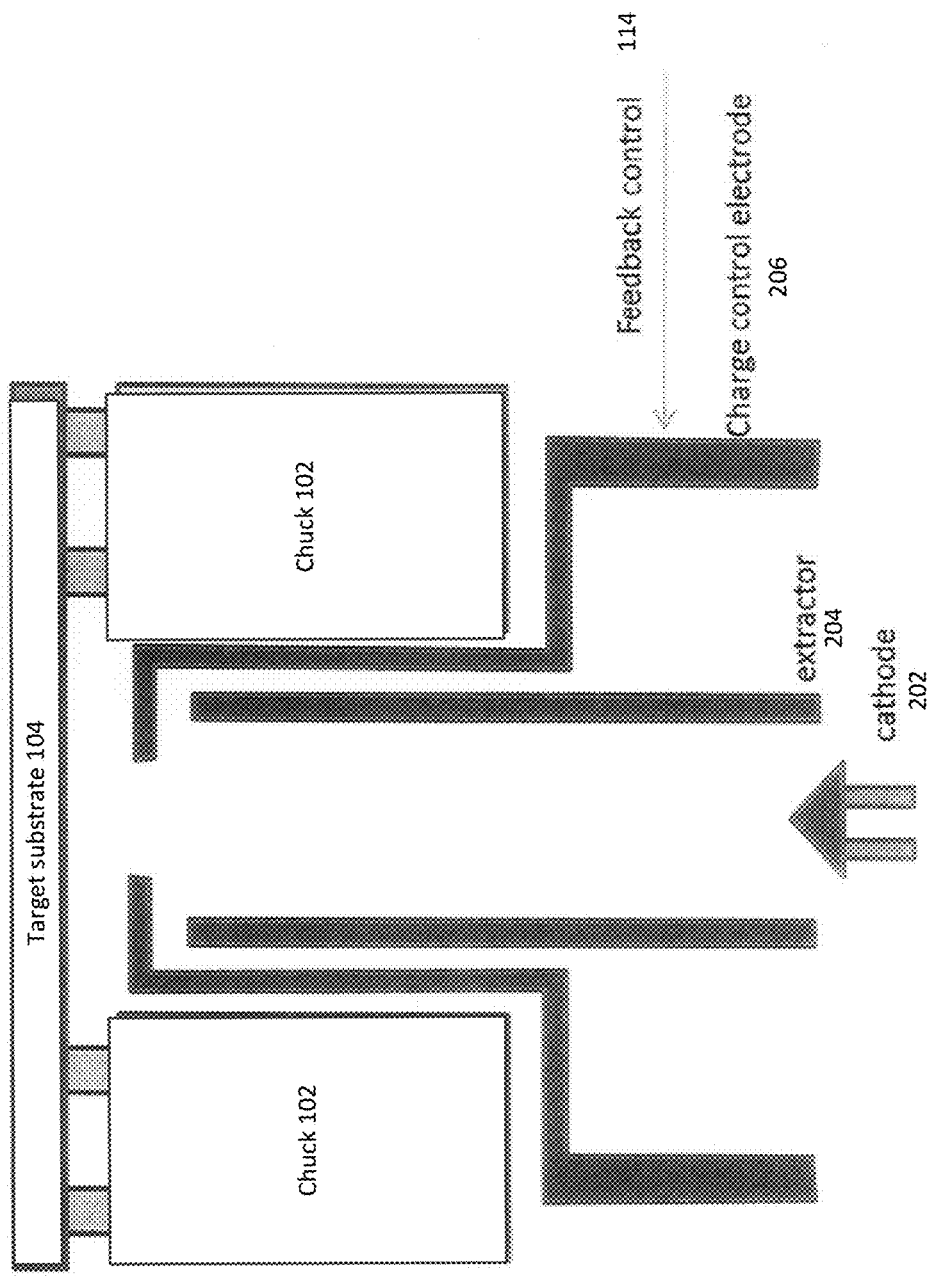
FIG. 2 provides a closer view of the electron-beam floodgun in accordance with an embodiment of the invention.

FIG. 2 provides a closer view of the electron-beam flood gun 116 in accordance with an embodiment of the invention. As shown, the electron-beam flood gun 116 may include a cathode emitter 202, an extractor electrode 204, and a charge control electrode 206.

The cathode emitter 202 may be one of several types. These types include, for example, a thermionic emitter, a field emission emitter, a cold field emission emitter, a photocathode emitter, or a nano-tube array emitter.

The extraction electrode 204 may be included to accelerate the electrons to a modest energy level. The extraction electrode 204 may be cylindrical, for example, as depicted. For example, the energy of the electron beam after acceleration by the extraction electrode 204 may be in a range from 100 eV to 3000 eV. In accordance with an embodiment of the invention, the electron-beam flood gun 116 is configured such that the energy of the electron beam is sufficient to penetrate any oxide film on the surface of the target substrate.

In further accordance with an embodiment of the invention, the energy of the beam may be tuned so that it is between the E1 and E2 points of the secondary yield curve, so that the secondary yield is more than one. (The E1 and E2 points are crossover energies on the secondary yield curve, where the yield crosses the unity level. If the beam energy is between E1 and E2, the yield is greater than one.) By operating at a point where the secondary yield is greater than one, it is possible to extract more electrons from the wafer than are injected into it. This advantageously allows for negative charge dissipation, as well as positive charge dissipation.

In further accordance with an embodiment of the invention, a charge control electrode 206 may be arranged between the extractor 204 for the flood beam and the backside of the target substrate 104. The charge control electrode 206 may be a Wehnelt electrode (having a cylindrical portion on the outside of the extractor 204) or may be a conductive mesh grid.

A variable voltage may be applied to the charge control electrode 206, such that secondary electrons can either be extracted from the target substrate (leading to a more positive substrate potential) or forced back to the substrate surface (leading to a more negative substrate potential). In particular, when the charge control electrode is set to a positive voltage relative to the nominal substrate voltage, then it will tend to pull secondary electrons away from the target substrate, driving the substrate to a more positive potential. On the other hand, when the charge control electrode is set to a negative voltage relative to the nominal substrate voltage, then it will tend to push secondary electrons back into the target substrate, driving the substrate to a more negative potential.

In accordance with an embodiment of the invention, the feed back control signal 114 provides the variable voltage that is applied to the charge control electrode 206. The voltage is controlled by the control signal 110 sent from the control circuitry 108 to the flood gun supply 112.

Thus, the apparatus 100 provides a feedback loop system that keeps the target substrate at a constant potential or at a potential within a set range. For example, if the voltmeter 106 senses that the substrate potential is becoming too positive, the control circuit 108 may adjust the voltage applied to the charge control electrode 206 in a negative direction to start driving the substrate to the desired potential by pushing electrons back into the substrate 104. On the other hand, if the voltmeter 106 senses that the substrate potential is becoming too negative, the control circuit 108 may adjust the voltage applied to the charge control electrode 206 in a positive direction to start driving the substrate to the desired potential by pulling electrons from the substrate 104.

In accordance with an embodiment of the invention, the electrostatic voltmeter 106 is positioned to be separated by some distance from the flood gun 116. For example, as depicted, part of the chuck 102 may be between the positions of the voltmeter 106 and the flood gun 116. Alternatively, the voltmeter 106 and the flood gun 116 may be positioned in proximity to each other, but such a configuration may result in charges due to the flood gun 116 interfering with the accuracy of the voltage measurement.

Figure 3:
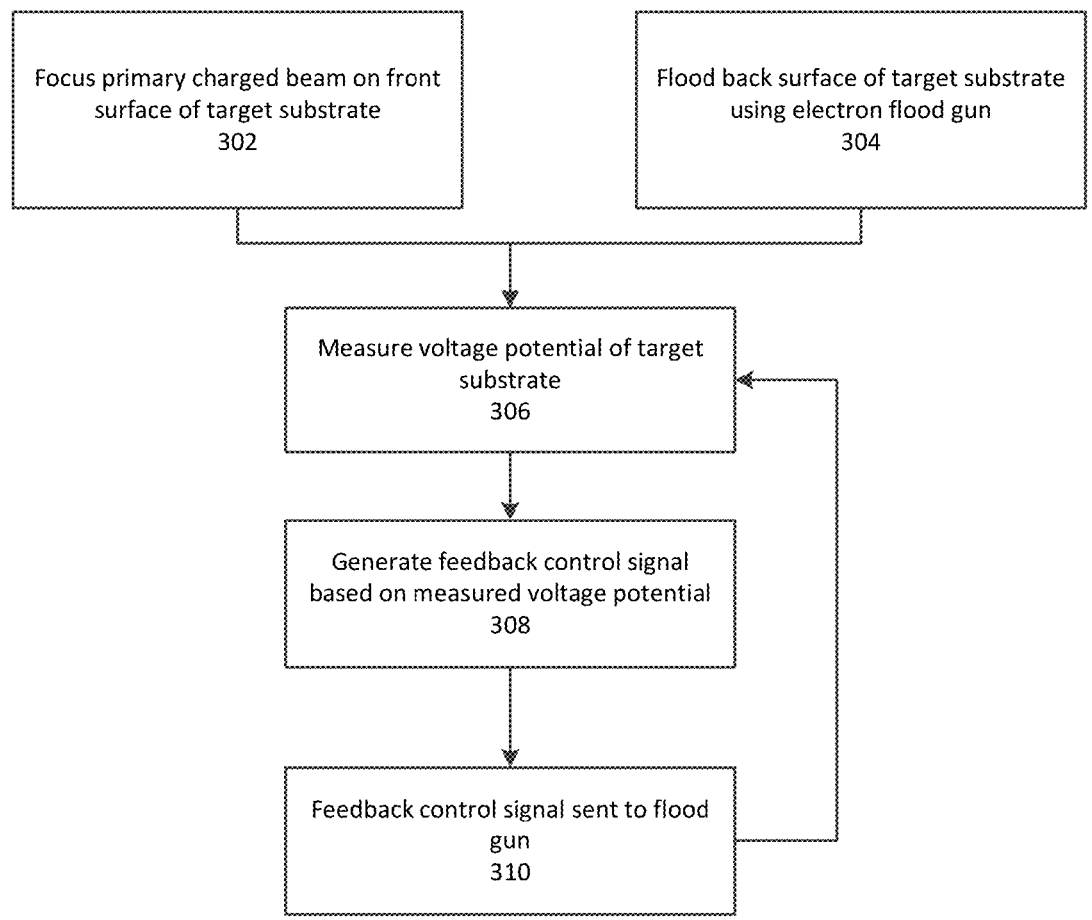
FIG. 3 is a flow chart of a method for virtual grounding of a target substrate using a floodgun and feedback control in accordance with an embodiment of the invention.

FIG. 3 is a flow chart of a method for virtual grounding of a target substrate using a floodgun and feedback control in accordance with an embodiment of the invention. As shown, per block 302, the primary charged beam (i.e. the process beam that may be an electron beam or an ion beam, depending on the use of the apparatus) may be focused on a front surface of the target substrate.

Per block 306, a measurement of the voltage potential of the target substrate may be made. For example, using a Kelvin probe or other voltmeter.

Per block 308, a feedback control signal may be generated based on the measured voltage potential. The feedback control signal may depend on a comparison between the measured voltage potential and a set voltage potential that the apparatus is configured to maintain. For example, the set voltage potential may be configurable by the operator of the charged-particle apparatus.

Per block 310, the feedback control signal may be sent to the flood gun. In one implementation, the feedback control signal is a variable voltage signal that is applied to a charge control electrode for the flood gun.

Blocks 306 to 310 form a feedback control loop. This feedback control loop maintains the substrate voltage at the set (fixed) voltage potential.

Figure 4:
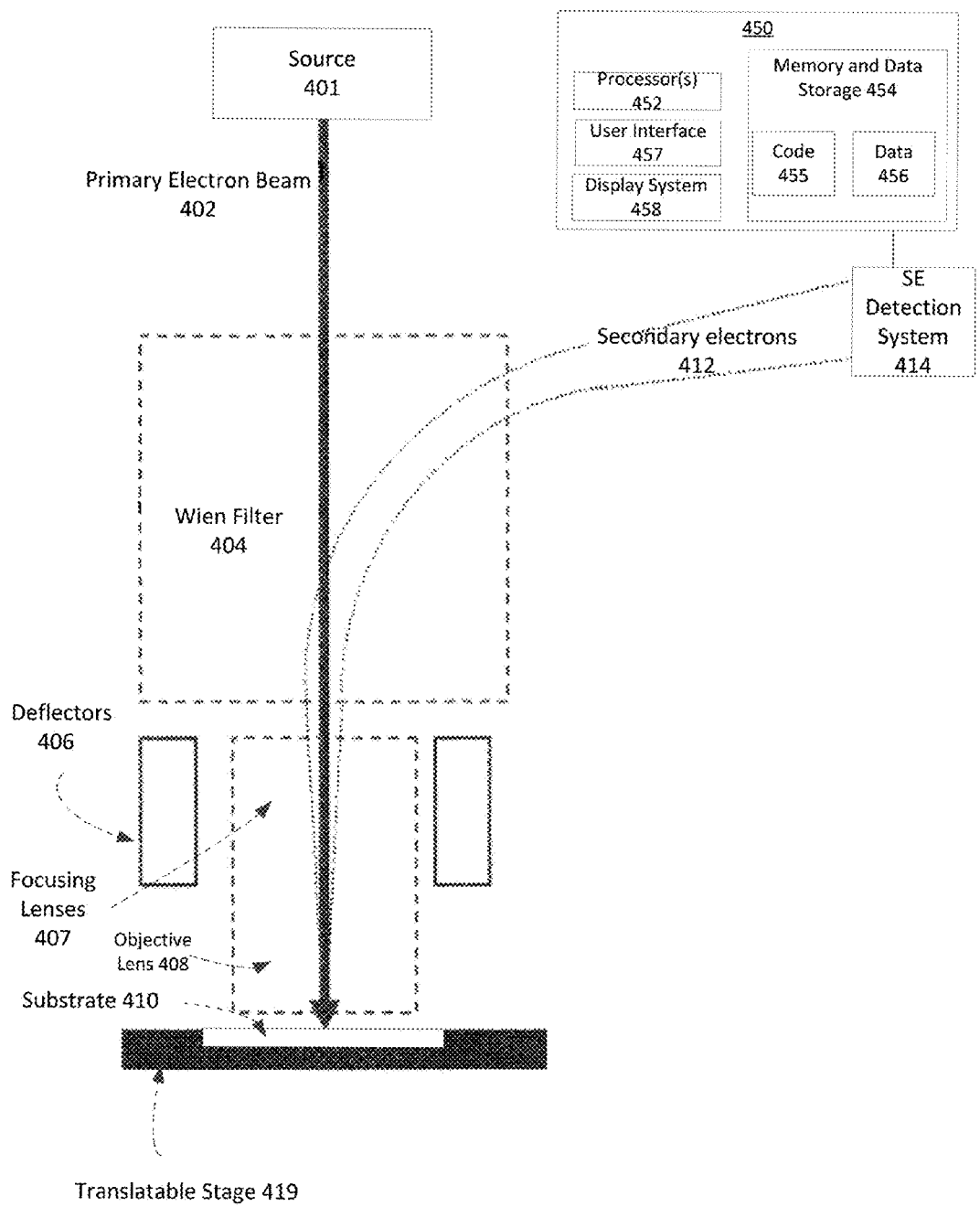
FIG. 4 is a schematic diagram of a scanning electron microscope apparatus in accordance with an embodiment of the invention.

FIG. 4 is a schematic diagram of a scanning electron microscope apparatus in accordance with an embodiment of the invention. As shown in the cross-sectional view of FIG. 4, the electron beam column may include a source 401, a Wien filter, scanning deflectors 406, focusing lenses 407, an objective lens 408, and a translatable stage 419 holding a target substrate 410.

The source 401 generates an incident electron beam (primary electron beam) 402. The incident electron beam 402 may pass through a Wien filter 404. The Wien filter 404 is an electron-optical element configured to generate electrical and magnetic fields which cross each other. Controllable electrostatic deflectors 406 and focusing electron lenses 407 may be utilized. The deflectors 406 may apply independently-controllable electrostatic fields in the x direction and in the y direction. The deflectors 406 may be controlled to scan the e-beam across the surface of the target substrate 410 or deflect the e-beam for other purposes. The target substrate 410 may be, for example, a patterned substrate, such as an integrated circuit being manufactured or a reticle for lithography.

The focusing electron lenses 407 are utilized to focus the incident electron beam 402 into a beam spot on the surface of the wafer or other substrate sample 410. In accordance with one embodiment, the focusing lenses 407 may operate by generating electric and/or magnetic fields.

As a result of the scanning of the incident electron beam 402, secondary electrons and x-rays are emitted or scattered from the surface of the target substrate 410 (which may be, for example, a semiconductor wafer or a reticle). The target substrate 410 may be held by a movable stage 411.

The secondary electrons may be extracted from the target substrate 410 by exposure to the electromagnetic field of the objective (final) lens 408. The electromagnetic field acts to confine the emitted electrons to within a relatively small distance from the incident electron beam optic axis and to accelerate these electrons up into the column. In this way, a secondary e-beam 412 is formed from the secondary electrons.

The Wien filter 404 deflects the secondary e-beam 412 from the optic axis of the incident electron beam 402 to a detection axis that is the optical axis for the secondary electron (SE) detection system 414 of the apparatus. This serves to separate the scattered e-beam 412 from the incident electron beam 402. The SE detection system 414 detects the secondary e-beam 412 and generates data signals that may be utilized to create images of the surface of the target substrate.

An instrument control and data processing (control/processing) system 450 may include one or more processors (i.e. microprocessors or microcontrollers) 452, data storage (including, for example, hard disk drive storage and memory chips) 454, a user interface 457 and a display system 458. The data storage 454 may store or hold computer-readable program code (instructions) 455 and data 456, and the processor 452 may execute the program code 455 and process the data 456. The user interface 457 may receive user inputs. The display system 458 may be configured to display image data and other information to a user.

The control/processing system 450 may be connected to, and may be used to control, various components of the e-beam column so as to implement methods or procedures disclosed herein. For example, the movement of the stage 411, and the scanning by the deflectors 406 may be controlled by computer-readable program code 455 executed by the control/processing system 450. In addition, the control/processing system 450 may also process the electron image data from the detection system 414.

As disclosed herein, the translatable stage 419 may be configured to apply a "virtual" ground to the target substrate 410 using the apparatus and methods described above in relation to FIGS. 1 to 3. As described above, the virtual ground may be applied using a flood gun and feedback control. The virtual ground advantageously provides an electrical grounding to the target substrate without using grounding pins that often need to penetrate a thick oxide film covering the target substrate.

Note that there are alternate embodiments to the apparatus and methods described above.

In one alternative embodiment, instead of a flood gun 116, a deep ultraviolet lamp or laser may be used to generate photoelectrons. Depending on the polarity of charge required, the lamp and/or control electrodes may be arranged to extract photoelectrons from the target substrate (to drive the substrate potential in the positive direction), or extract photoelectrons from another nearby surface and direct them into the target substrate (to drive the substrate potential in the negative direction).

In another alternative embodiment, instead of a flood gun 116 that generates electrons, an ion gun may be used to generate positive or negative ions. Similarly, in another alternate embodiment, ions may be generated by a plasma process involving a partial pressure of gas injected into a cavity under the target substrate and excitation of the gas by DC, AC, or RF voltages. The generated ions may then be accelerated into (or extracted from) the target substrate.

Consider an embodiment where the ion gun generates negative ions. In this case, when the voltmeter 106 senses that the substrate potential is becoming too positive, the control circuit 108 may adjust the voltage applied to the charge control electrode 206 in a negative direction to start driving the substrate to the desired potential by pushing the negative ions back to the substrate 104. On the other hand, if the voltmeter 106 senses that the substrate potential is becoming too negative, the control circuit 108 may adjust the voltage applied to the charge control electrode 206 in a positive direction to start driving the substrate to the desired potential by pulling the negative ions from the substrate 104.

Consider an embodiment where the ion gun generates positive ions. In this case, when the voltmeter 106 senses that the substrate potential is becoming too positive, the control circuit 108 may adjust the voltage applied to the charge control electrode 206 in a negative direction to start driving the substrate to the desired potential by pulling positive ions from the substrate 104. On the other hand, if the voltmeter 106 senses that the substrate potential is becoming too negative, the control circuit 108 may adjust the voltage applied to the charge control electrode 206 in a positive direction to start driving the substrate to the desired potential by pushing the positive ions back to the substrate 104.

In another alternative embodiment, the energy of the flood beam may be modulated about the E1 or E2 point to control the polarity of the charge control, rather than using a Wehnelt electrode or conductive grid.

In another alternative embodiment, an alternative technique for sensing the substrate potential, other than using a separate electrostatic voltmeter, may be utilized. One alternative technique may use a focus signal from the imaging beam to determine whether the substrate potential is too positive or too negative. Another alternative technique may use data derived from an energy filter or spectrometer of the SE detection system to determine whether the substrate potential is too positive or too negative.

In another alternative embodiment, the flood beam may impinge the target substrate from the front side at a different axis from the process beam (i.e. the primary beam for the inspection/review or lithography system). This alternative position of the flood gun (E-gun) 116a and the corresponding feedback control signal 114a are depicted with dashed lines in FIG. 1. In this case, the flood beam may be emitted only periodically (rather than continuously). The periodic use of the flood beam may occur as the target substrate temporarily moves under the flood gun 116a.

In another alternative embodiment, the flood beam may impinge on the target substrate from the front side on the same axis as the process beam. In this case, the flood beam and the process beam may be time-multiplexed so as not to interfere with each other. In one implementation of the time multiplexing, the process beam may be raster scanned over a surface area, while the flood beam may be used during a scan retrace time as the process beam is moved to the next line of the scan. In another implementation of the time multiplexing, the flood beam may be used during a stage move between process sites (for example, between defect sites being imaged in a review apparatus), when the process beam is not active. In each of these implementations, when the process beam is active, the flood beam may be blanked (blocked).

CONCLUSION

The above-described diagrams are not necessarily to scale and are intended be illustrative and not limiting to a particular implementation. Specific dimensions, geometries, and lens currents of the magnetic objective lens will vary and depend on each implementation.

The above-described technique may be used, for example, in an automatic inspection and defect analysis system and applied to the inspection and review of wafers, X-ray masks and similar substrates in a production environment. Other uses are also possible.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for virtual grounding of a target substrate in a charged-particle beam apparatus, the apparatus comprising:
   a primary gun that generates charged particles for a process beam that is focused on a frontside surface of the target substrate;
   a stage for holding the target substrate;
   an electrostatic voltmeter that measures a voltage potential of the target substrate;
   a charge-control gun that impinges a beam of charged particles to the target substrate; and
   a feedback control loop that controls the charge-control gun depending on the voltage potential measured by the electrostatic voltmeter.

2. The apparatus of claim 1, wherein the electrostatic voltmeter measures the voltage potential from a backside surface of the target substrate.

3. The apparatus of claim 2, wherein the electrostatic voltmeter is embedded within a chuck of the stage.

4. The apparatus of claim 2, wherein the stage comprises a chuck, and wherein the electrostatic voltmeter is arranged to access the backside surface of the target substrate by way of a hole in the chuck.

5. The apparatus of claim 1, wherein the electrostatic voltmeter comprises a Kelvin probe.

6. The apparatus of claim 1, wherein the charge-control gun comprises a flood gun that generates a beam of electrons, and wherein the beam of electrons from the flood gun is directed to the backside surface of the target substrate.

7. The apparatus of claim 6, wherein the stage comprises a chuck, and wherein the flood gun is arranged to access the backside surface of the target substrate by way of a hole in the chuck.

8. The apparatus of claim 6, wherein the beam of electrons from the flood gun is directed to the frontside surface of the target substrate.

9. The apparatus of claim 8, wherein the flood gun emits the beam of electrons towards the front surface only periodically.

10. The apparatus of claim 9, wherein the beam of electrons is emitted along a same axis as the process beam, and wherein the beam of electrons and the process beam are time multiplexed.

11. The apparatus of claim 6, wherein the feedback control loop provides a feedback control signal that is a voltage that is applied to a charge control electrode of the flood gun.

12. The apparatus of claim 11, wherein the charge control electrode comprises a Wehnelt electrode.

13. The apparatus of claim 11, wherein the charge control electrode comprises a conductive mesh grid.

14. The apparatus of claim 6, wherein the beam of electrons is at an energy between E1 and E2 crossover energies on a secondary yield curve.

15. The apparatus of claim 6, wherein the feedback control loop provides a feedback control signal that modulates an energy of the beam of electrons from the flood gun.

16. A method for virtual grounding of a target substrate in a charged-particle beam apparatus, the method comprising:
   focusing a process beam of charged particles upon a front surface of the target substrate;
   measuring an electrostatic potential of the target substrate using an electrostatic voltmeter;
   generating a feedback control signal based on the electrostatic potential; and
   adjusting a charge-control beam that impinges upon the target substrate based on the feedback signal, wherein the charge-control beam impinges upon a back surface of the target substrate.

17. The method of claim 16, wherein the charge-control beam comprises a beam of electrons from a flood gun.

18. The method of claim 16, wherein the charge-control beam comprises a beam of ions from an ion gun.

19. An apparatus for automated inspection and/or review of a target substrate, the apparatus comprising:
   an electron beam column for generating a primary electron beam and focusing the primary electron beam onto a frontside surface of the target substrate;
   a moveable stage for holding the target substrate under the primary electron beam;

means for measuring a voltage potential of the target substrate;

a flood gun that impinges a beam of electrons onto the backside surface of the target substrate; and a feedback control loop that adjusts a charge control electrode of the flood gun depending on the voltage potential.

20. The apparatus of claim 19, wherein the means for measuring the voltage potential comprises using a focus signal from the primary electron beam.

21. The apparatus of claim 19, wherein the means for measuring the voltage potential comprises using data from a secondary electron detection system of the apparatus.

* * * * *